US009356431B2

(12) United States Patent
Pourhashemi et al.

(10) Patent No.: US 9,356,431 B2
(45) Date of Patent: May 31, 2016

(54) HIGH POWER BLUE-VIOLET III-NITRIDE SEMIPOLAR LASER DIODES

(71) Applicant: The Regents of the University of California, Oakland, CA (US)

(72) Inventors: Arash Pourhashemi, Santa Barbara, CA (US); Robert M. Farrell, Goleta, CA (US); Steven P. DenBaars, Goleta, CA (US); James S. Speck, Santa Barbara, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/766,924

(22) PCT Filed: Feb. 13, 2014

(86) PCT No.: PCT/US2014/016275
§ 371 (c)(1),
(2) Date: Aug. 10, 2015

(87) PCT Pub. No.: WO2014/127136
PCT Pub. Date: Aug. 21, 2014

(65) Prior Publication Data
US 2015/0372456 A1    Dec. 24, 2015

Related U.S. Application Data

(60) Provisional application No. 61/764,449, filed on Feb. 13, 2013.

(51) Int. Cl.
*H01S 5/00* (2006.01)
*H01S 5/343* (2006.01)
*H01S 5/32* (2006.01)
*H01S 5/30* (2006.01)
*H01S 5/40* (2006.01)
*H01S 5/02* (2006.01)

(52) U.S. Cl.
CPC ............ *H01S 5/34333* (2013.01); *H01S 5/0217* (2013.01); *H01S 5/3063* (2013.01); *H01S 5/3202* (2013.01); *H01S 5/4025* (2013.01)

(58) Field of Classification Search
USPC ......................... 372/45.012; 257/9, E33.005
See application file for complete search history.

(56) References Cited

U.S. PATENT DOCUMENTS

2006/0234486 A1* 10/2006 Speck .................... C30B 25/02
                                                              438/590
2011/0062449 A1*  3/2011 Farrell, Jr. ............. B82Y 20/00
                                                              257/76

(Continued)

OTHER PUBLICATIONS

Gardner, N. F. et al. "Blue-emitting InGaN-GaN double-heterostructure light-emitting diodes reaching maximum quantum efficiency above 200 A/cm2", Applied Physics Letters, vol. 91, 243506, 2007.

(Continued)

*Primary Examiner* — Tuan Nguyen
(74) *Attorney, Agent, or Firm* — Gates & Cooper LLP

(57) ABSTRACT

A high power blue-violet III-nitride semipolar laser diode (LD) with an output power in excess of 1 W, a slope efficiency of more than 1 W/A, and an external quantum efficiency (EQE) in excess of 25% and more preferably, in excess of 35%. These operating characteristics make these laser diodes suitable for use in solid state lighting systems.

24 Claims, 4 Drawing Sheets

(56) References Cited

U.S. PATENT DOCUMENTS

| | | | |
|---|---|---|---|
| 2012/0076165 A1* | 3/2012 | Chakraborty | B82Y 20/00 372/45.01 |
| 2012/0199809 A1* | 8/2012 | Schmidt | B82Y 20/00 257/9 |
| 2012/0205620 A1* | 8/2012 | Sato | H01L 33/32 257/13 |

OTHER PUBLICATIONS

Kioupakis, E. et al. "Determination of Internal Loss in Nitride Lasers from First Principles", Applied Physics Express, vol. 3, 082101, 2010.

Krames et al. "Status and Future of High-Power Light-Emitting Diodes for Solid-State Lighting", Journal of Display Technology, vol. 3, No. 2, pp. 160-175, 2007.

Nakamura, S. et al. "InGaN/GaN/AlGaN-based laser diodes with modulation-doped strained-layer superlattices grown on an epitaxially laterally overgrown GaN substrate", Appl. Phys. Lett., vol. 72, No. 2, pp. 211-213, 1998.

PCT International Search Report and Written Opinion dated May 14, 2014 for PCT Application No. PCT/US14/16275.

* cited by examiner

US 9,356,431 B2

HIGH POWER BLUE-VIOLET III-NITRIDE SEMIPOLAR LASER DIODES

CROSS REFERENCE TO RELATED APPLICATION

This application claims the benefit under 35 U.S.C Section 119(e) of the following commonly-assigned patent application:

U.S. Provisional Patent Application Ser. No. 61/764,449, filed on Feb. 13, 2013, by Arash Pourhashemi, Robert M. Farrell, Steven P. DenBaars, James S. Speck, and Shuji Nakamura, and entitled "HIGH POWER BLUE-VIOLET III-NITRIDE SEMIPOLAR LASER DIODES,"

which application is incorporated by reference herein.

BACKGROUND OF THE INVENTION

1. Field of the Invention

This invention relates to high-power blue-violet III-nitride semipolar laser diodes (LDs).

2. Description of the Related Art (Note: This application references a number of different publications as indicated throughout the specification by one or more reference numbers within brackets, e.g., [Ref x]. A list of these different publications ordered according to these reference numbers can be found below in the section entitled "References." Each of these publications is incorporated by reference herein.)

Conventional solid-state lighting systems use a III-nitride light-emitting diode (LED) that emits blue light to excite a phosphor, typically Ce-doped yttrium aluminium garnet (YAG), that emits yellow light. [Ref. 1] Some of the blue light from the LED is transmitted through the phosphor and is combined with the yellow light from the phosphor to create a dichromatic white light source. Although LEDs show promise for solid-state lighting applications, they nevertheless suffer from efficiency droop at high injection levels. [Ref. 2]

As an alternative to LEDs, LDs can be used to generate blue light. Since the carrier density in LDs clamps at threshold, there is no efficiency droop in LDs as in LEDs.

An advantage of using a LD instead of an LED is that the light emitted by a LD is spatially and temporally coherent, so both the directionality and efficiency of the light extraction can be precisely controlled through the design of the optical cavity. In contrast, the light emitted by an LED is spatially and temporally incoherent, meaning that some fraction of the light emitted by the LED is always going to be lost due to absorption at the backside of the LED, absorption at metal contacts on the top side of the LED, or potentially misdirected emission from the sidewalls of the LED.

Another advantage of LDs over LEDs is the current injection regime in which LDs operate. In order to achieve high EQEs, LEDs need to operate at low current densities. LDs, however, can achieve high EQEs at many orders of magnitude higher current density than LEDs. This will result in higher output power densities, which can be use to offset the cost of the substrates needed in the fabrication of the LDs.

Thus, there is a need in the art for improved methods of fabricating high-power blue-violet LD structures. The present invention satisfies this need.

SUMMARY OF THE INVENTION

The present invention describes a high-power blue-violet III-nitride semipolar LD with an output power in excess of 1 W, a slope efficiency of more than 1 W/A, and an external quantum efficiency (EQE) in excess of 25% and more preferably, in excess of 35%. These operating characteristics make these laser diodes suitable for use in solid state lighting systems.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Device Structure

Figure 1:
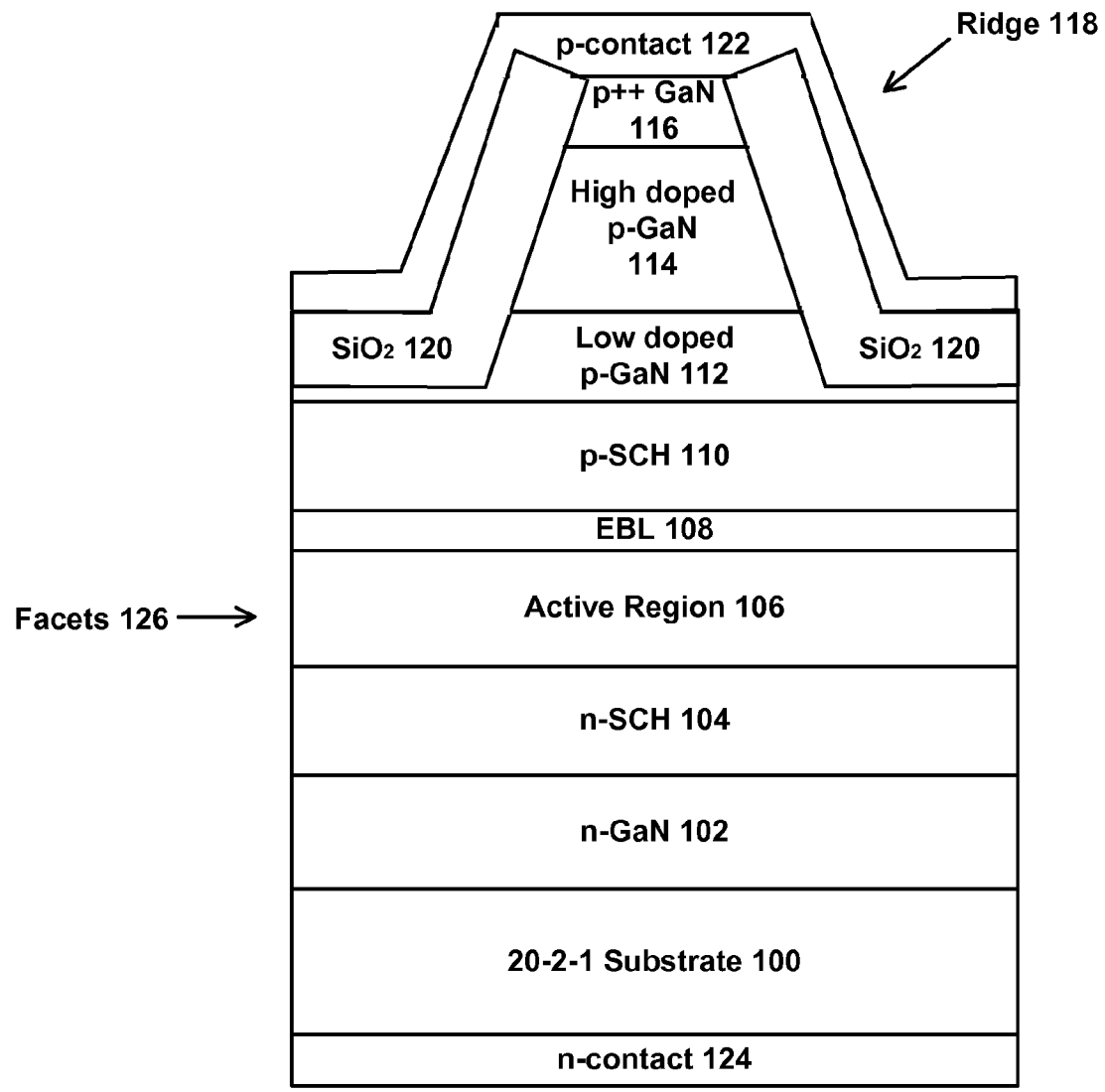
FIG. 1 shows a cross-sectional schematic of a proposed device structure according to one embodiment of the present invention.

FIG. 1 shows a cross-sectional schematic of a proposed device structure according to one embodiment of the present invention. Metalorganic chemical vapor deposition (MOCVD) was used to grow an AlGaN-cladding-free (ACF) LD structure comprised of one or more III-nitride layers on a freestanding semipolar (20-2-1) GaN substrate 100 manufactured by Mitsubishi Chemical Corporation. The LD structure is comprised of a 1 µm Si-doped n-GaN cladding layer 102, a 60 nm n-type separate confinement heterostructure (SCH) 104, a 4 period undoped multiple quantum well (MQW) active region 106 with 5 nm $In_{0.20}Ga_{0.80}N$ QWs and 15 nm GaN barriers, a 17 nm Mg-doped p-type $Al_{0.15}Ga_{0.85}N$ electron blocking layer (EBL) 108, a 60 nm very low Mg-doped ($[Mg]=7.5\times10^{17}$ cm$^{-3}$) p-type SCH layer 110, a 200 nm relatively low Mg-doped ($[Mg]=1.5\times10^{18}$ cm$^{-3}$) p-type GaN cladding layer 112, a 400 nm relatively high Mg-doped ($[Mg]=7.5\times10^{18}$ cm$^{-3}$) p-GaN cladding layer 114, and a 20 nm highly Mg-doped ($[Mg]=1\times10^{20}$ cm$^{-3}$) p++-GaN contact layer 116.

Following the MOCVD growth, the sample was processed into a ridge waveguide LD using a self-aligned dry etch and insulator lift-off process. The final ridge waveguide LD was comprised of a 500 nm deep ridge 118 aligned parallel to the c-axis, with a ridge 118 length of 900 µm and a ridge 118 width of 8 µm.

In addition, 200 nm of $SiO_2$ 120 was deposited for electrical insulation, 30/1000 nm of Pd/Au was deposited for the p-contacts 122, and 50/300 nm of Al/Au was deposited for a common n-contact 124.

Facets 126 were formed by dicing and polishing. The facets 126 were coated in order to increase the slope efficiency of the LD. The back side facet 126 was coated with a 4 period high-reflectivity (HR) coating with alternating quarter-wavelength thick layers of $SiO_2$ and $Ta_2O_5$. The front side facet 126 was coating with a 1 period anti-reflective (AR) coating with quarter-wavelength thick layers of $Ta_2O_5$ and $SiO_2$.

Experimental Results

After completion of the device fabrication, the electrical and luminescence characteristics of the unpackaged and uncoated devices were measured by on-wafer probing. Measurements were collected at room temperature and with a pulse width of 1 µs and a repetition rate of 10 kHz, corresponding to a duty cycle of 1%.

The emission wavelength of the blue-violet III-nitride semipolar LD was between 380 nm and 480 nm. The optical mode of the device was well-confined by the relatively wide active region 106 and the SCH 104, with a transverse confinement factor, $\Gamma_{active}$, of 4.7%. In addition, a substantial portion of the optical mode was confined within the low Mg-doped p-type SCH 110 and p-type GaN layers 112, 114, 116, corresponding to transverse confinement factors of $\Gamma_{p\text{-}SCH}$=10.8% and $\Gamma_{p\text{-}GaN}$=17.3%, respectively. This non-uniform Mg doping profile was designed to decrease the total absorption loss in the device by reducing phonon assisted absorption by acceptor-bound holes, which first principle calculations predict should make the single largest contribution to modal loss in III-nitride LDs and should scale with Mg doping density. [Ref. 3]

Figure 2:
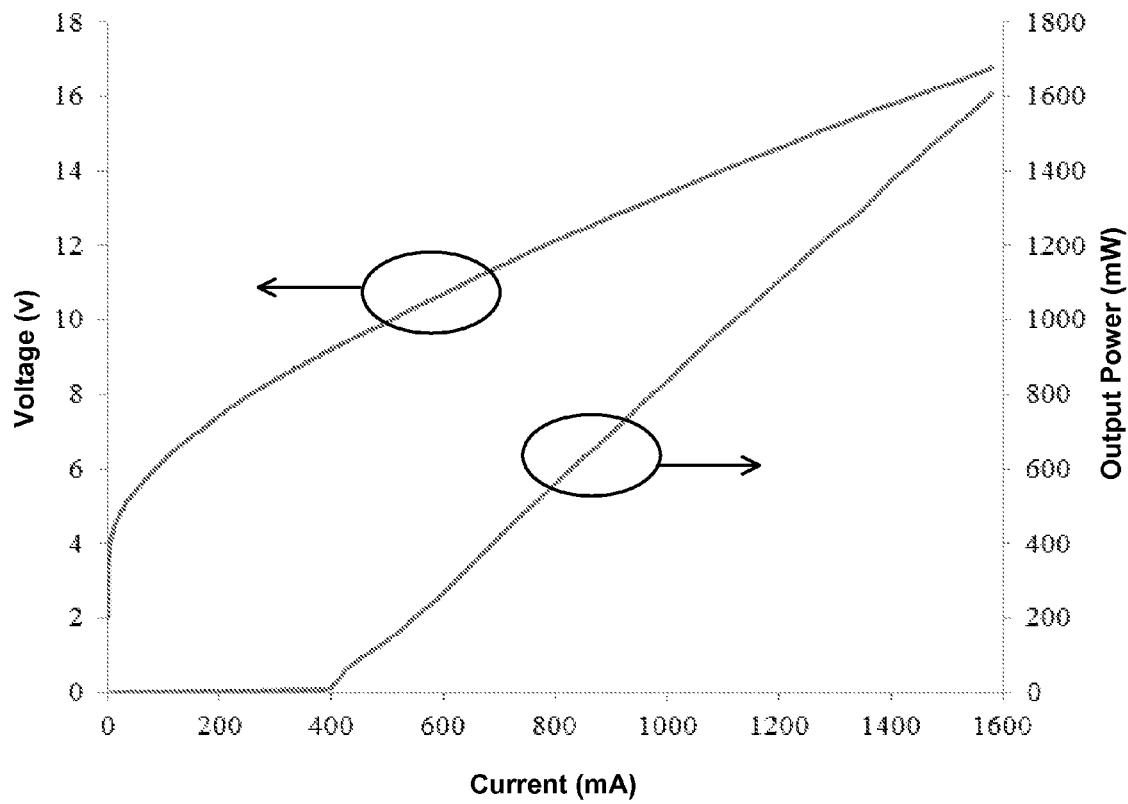
FIG. 2 is a graph that illustrates the light-current-voltage (L-I-V) curve for the device of FIG. 1.

FIG. 2 is a graph that illustrates the light-current-voltage (L-I-V) curve for the device of FIG. 1. The L-I characteristic shows a threshold current ($I_{th}$) of 392 mA, which corresponds to a threshold current density ($J_{th}$) of 5.30 kA/cm². The slope efficiency was 1.34 W/A, corresponding to a the differential efficiency ($\eta_d$) of 0.48. The maximum output power, which was limited by the power supply, was 1.6 W for a current of 1.58 A.

Specifically, the graph shows the following output power: more than about 200 mW and less than about 400 mW at about 600 mA, about 600 mW at about 800 mA, more than about 800 mW and less than about 1000 mW at about 1000 mA, more than about 1000 mW and less than about 1200 mW at about 1200 mA, more than about 1200 mW and less than about 1400 mW at about 1400 mA, and about 1600 mW (1.6 W) at about 1580 mA (1.58 A).

Figure 3:
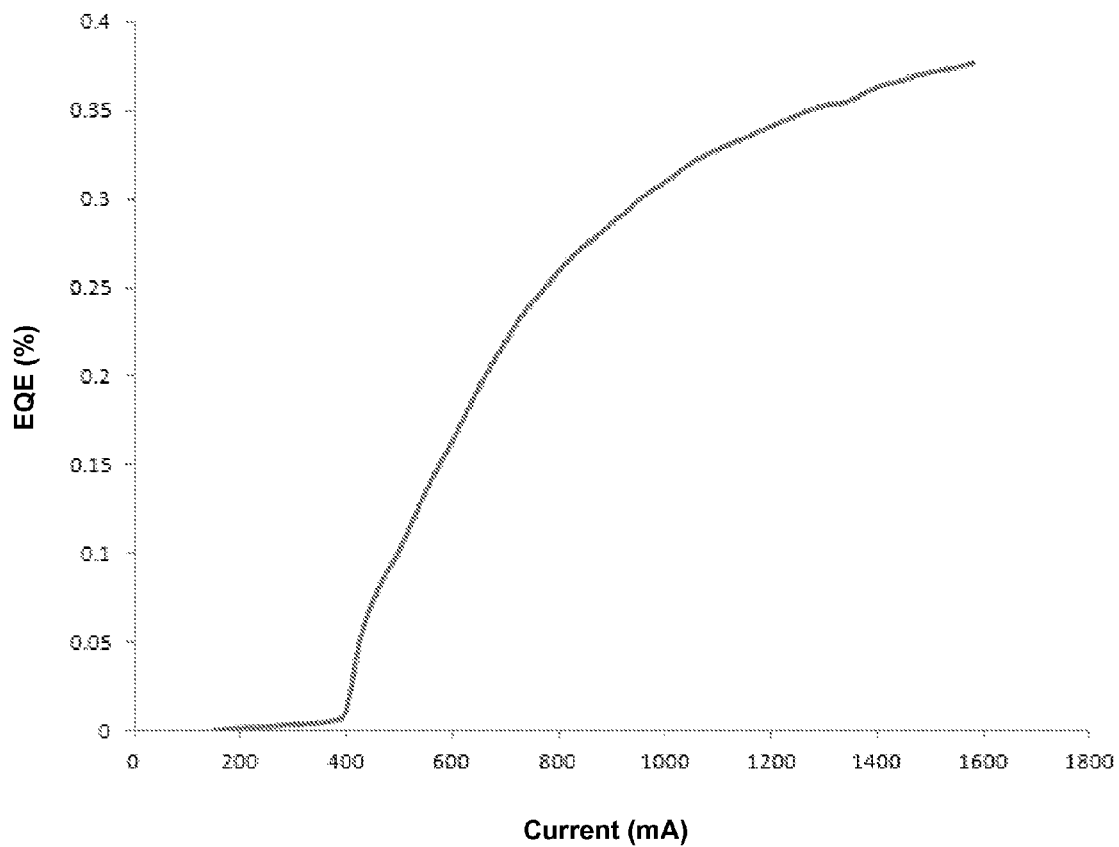
FIG. 3 is a graph that illustrates the dependence of external quantum efficiency on current for the device of FIG. 1.

FIG. 3 is a graph that illustrates the dependence of external quantum efficiency (EQE) on current for the device of FIG. 1. The blue-violet III-nitride semipolar LD has an EQE in excess of 25%. Although the EQE was relatively low at low current densities, the EQE increased monotonically with current to a maximum of 37% at 1.58 A.

Specifically, the graph shows the following EQE: about 0.15 or 15% at about 600 mA, about 0.25 or 25% at about 800 mA, about 0.3 or 30% at about 1000 mA, about 0.35 or 35% at about 1200 mA, about 0.35 or 35% at about 1400 mA, and about 0.37 or 37% at about 1580 mA. Even higher EQEs should be achievable with further increases in the efficiency of the LDs and with increases in the peak output of the power supply.

Process Flowchart

Figure 4:
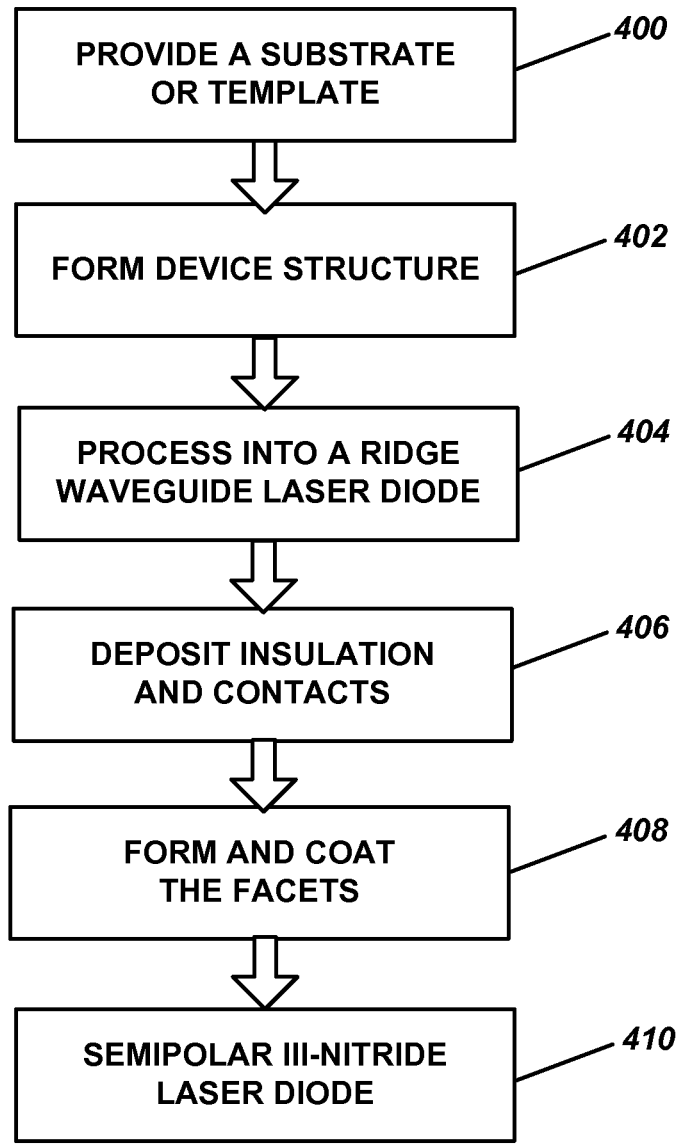
FIG. 4 is a flowchart that illustrates a method for fabricating a light emitting device according to one embodiment of the present invention.

FIG. 4 is a flowchart that illustrates a method for fabricating a light emitting device according to the present invention. The fabrication of the device may use well-established semiconductor device processing techniques, including lithography, etching and deposition processes.

Block 400 represents the step of providing a substrate or template. In one embodiment, the substrate may be a free-standing III-nitride substrate, such as a semipolar (20-2-1) GaN substrate. In various embodiments, the free-standing III-nitride substrate may be:

a semipolar III-nitride wafer sawn from a bulk III-nitride ingot or boule;

a thick semipolar III-nitride layer removed from a foreign substrate;

a III-nitride template grown on or above a foreign substrate; or a nucleation layer, buffer layer or epitaxial lateral overgrowth (ELO) layer grown on or above a foreign substrate.

Block 402 represents the step of epitaxially forming the device structure on or above the substrate or template, wherein the device structure is formed in a semipolar orientation. In one embodiment, the device structure is formed by MOCVD and comprises the ACF LD structure grown on or above the semipolar (20-2-1) GaN substrate described above in FIG. 1, which is fabricated in the following manner:

an active region of the blue-violet III-nitride semipolar laser diode comprises an MQW active region that is positioned between an n-type SCH and a p-type SCH;

an EBL is positioned between the active region and the p-type SCH;

the active region, the n-type SCH and the p-type SCH of the blue-violet III-nitride semipolar laser diode are positioned between one or more n-type III-nitride layers and one or more p-type III-nitride layers; and the p-type III-nitride layers comprise a relatively low Mg-doped p-type GaN cladding layer, a relatively high Mg-doped p-GaN cladding layer and a relatively highly Mg-doped p++-GaN contact layer (i.e., the relatively low Mg-doped p-type GaN cladding layer is less doped than the relatively high Mg-doped p-GaN cladding layer and the relatively high Mg-doped p-GaN cladding layer is less doped than the relatively highly Mg-doped p++-GaN contact layer).

However, other layers and structures may be fabricated in the LD as well.

Block 404 represents the step of processing the device structure into a ridge waveguide LD using a self-aligned dry etch and insulator lift-off process.

Block 406 represents the step of depositing $SiO_2$ for electrical insulation, Pd/Au for p-contacts, and Al/Au for a common n-contact.

Block 408 represents the step of forming facets by dicing and polishing, and then coating the facets with an HR coating and/or an AR coating.

Block 410 represents the end result of the process steps, namely, an opto-electronic device comprising at least one blue-violet III-nitride semipolar LD. However, the substrate or template may comprise a wafer on which an array of multiple semipolar III-nitride LDs may be fabricated. Moreover, the blue-violet III-nitride semipolar LDs may be used to excite one or more phosphors to produce white light.

Possible Modifications and Variations

The above section described a structure for a high power blue-violet III-nitride (20-2-1) LD. However, this particular structure and crystallographic orientation were only presented as an example for the purposes of illustration and description, and were not intended to be exhaustive or to limit the invention to this example. Many alternative structures and crystallographic orientations are also within the scope of this invention.

For example, this invention is also pertinent to semipolar planes other than just the semipolar (20-2-1) plane described herein, wherein such semipolar planes can be used for growing III-nitride semiconductor devices and have a polarization field that is in the opposite sense to the built-in field due to the p-n junction. As noted below, the term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index.

The scope of this invention also covers III-nitride devices with active region designs other than the 4 period undoped MQW active region with 5 nm $In_{0.20}Ga_{0.80}N$ QWs and 15 nm GaN barriers cited herein. This invention is also pertinent to III-nitride devices with active regions with a different number of QWs, active regions with QWs of any thickness, active regions with QWs of any alloy composition, active regions with barriers of any thickness, and active regions with barriers of any alloy composition.

Additional impurities or dopants can also be incorporated into the semipolar III-nitride thin films described in this invention. For example, Fe, Mg, Si, and Zn are frequently added to various layers in III-nitride heterostructures to alter the conduction properties of those and adjacent layers. The use of such dopants and others not listed here are within the scope of the invention.

The above section describes a high power blue-violet III-nitride (20-2-1) LD grown on a free-standing III-nitride substrate. Free-standing semipolar III-nitride substrates may be created by removing a foreign substrate from a thick semipolar III-nitride layer, by sawing a bulk III-nitride ingot or boule into individual semipolar III-nitride wafers, or by any other possible crystal growth or wafer manufacturing technique. The scope of this invention includes the growth of semipolar III-nitride thin films on all possible free-standing semipolar III-nitride wafers created by all possible crystal growth methods and wafer manufacturing techniques.

Moreover, substrates other than free-standing semipolar GaN could be used for III-nitride thin film growth. The scope of this invention includes the growth of semipolar III-nitride thin films on all possible crystallographic orientations of all possible foreign substrates. These foreign substrates include, but are not limited to, sapphire, silicon carbide, silicon, zinc oxide, boron nitride, lithium aluminate, lithium niobate, germanium, aluminum nitride, lithium gallate, partially substituted spinels, and quaternary tetragonal oxides sharing the $\gamma$-$LiAlO_2$ structure.

The scope of this invention also covers semipolar III-nitride thin films grown on epitaxial laterally overgrown (ELO) III-nitride templates. The ELO technique is a method of reducing the density of threading dislocations (TD) in subsequent epitaxial layers. Reducing the TD density leads to improvements in device performance. For c-plane III-nitride LEDs and LDs, these improvements include increased output powers, increased internal quantum efficiencies, longer device lifetimes, and reduced threshold current densities. [Ref 4] These advantages will be pertinent to all semipolar III-nitride LEDs and LDs grown on ELO templates.

Furthermore, variations in semipolar III-nitride nucleation (or buffer) layers and nucleation layer growth methods are acceptable for the practice of this invention. The growth temperature, growth pressure, orientation, and composition of the nucleation layers need not match the growth temperature, growth pressure, orientation, and composition of the subsequent semipolar thin films and heterostructures. The scope of this invention includes the growth of semipolar III-nitride thin films on all possible substrates using all possible nucleation layers and nucleation layer growth methods.

Nomenclature

The terms "Group-III nitride" or "III-nitride" or "nitride" as used herein refer to any composition or material related to (B, Al, Ga, In)N semiconductors having the formula $B_wAl_xGa_yIn_zN$ where $0 \leq w \leq 1$, $0 \leq x \leq 1$, $0 \leq y \leq 1$, $0 \leq z \leq 1$, and $w+x+y+z=1$. These terms as used herein are intended to be broadly construed to include respective nitrides of the single species, B, Al, Ga, and In, as well as binary, ternary and quaternary compositions of such Group III metal species. Accordingly, these terms include, but are not limited to, the compounds of AN, GaN, InN, AlGaN, AlInN, InGaN, and AlGaInN. When two or more of the (B, Al, Ga, In)N component species are present, all possible compositions, including stoichiometric proportions as well as off-stoichiometric proportions (with respect to the relative mole fractions present of each of the (B, Al, Ga, In)N component species that are present in the composition), can be employed within the broad scope of this invention. Further, compositions and materials within the scope of the invention may further include quantities of dopants and/or other impurity materials and/or other inclusional materials.

This invention also covers the selection of particular crystal orientations, directions, terminations and polarities of Group-III nitrides. When identifying crystal orientations, directions, terminations and polarities using Miller indices, the use of braces, { }, denotes a set of symmetry-equivalent planes, which are represented by the use of parentheses, ( ) The use of brackets, [ ], denotes a direction, while the use of brackets, < >, denotes a set of symmetry-equivalent directions.

Many Group-III nitride devices are grown along a "polar" orientation, namely a c-plane {0001} of the crystal, although this results in an undesirable quantum-confined Stark effect (QCSE), due to the existence of strong piezoelectric and spontaneous polarizations. One approach to decreasing polarization effects in Group-III nitride devices is to grow the devices along nonpolar or semipolar orientations of the crystal.

The term "nonpolar" includes the {11-20} planes, known collectively as a-planes, and the {10-10} planes, known collectively as m-planes. Such planes contain equal numbers of Group-III and Nitrogen atoms per plane and are charge-neutral. Subsequent nonpolar layers are equivalent to one another, so the bulk crystal will not be polarized along the growth direction.

The term "semipolar" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the crystal will have reduced polarization along the growth direction.

REFERENCES

The following references are incorporated by reference herein:

[1] M. R. Krames, O. B. Shchekin, R. Mueller-Mach, G. O. Mueller, L. Zhou, G. Harbers, and M. G. Craford, J. Disp. Technol. 3, 160 (2007).

[2] N. F. Gardner, G. O. Muller, Y. C. Shen, G. Chen, S. Watanabe, W. Gotz, and M. R. Krames, Appl. Phys. Lett. 91, 243506 (2007).

[3] E. Kioupakis, P. Rinke, and C. G. Van de Walle, Appl. Phys. Express 3, 082101 (2010).

[4] S. Nakamura, M. Senoh, S. Nagahama, N. Iwasa, T. Yamada, T. Matsushita, H. Kiyoku, Y. Sugimoto, T. Kozaki, H. Umemoto, M. Sano, and K. Chocho, Appl. Phys. Lett. 72, 211 (1998).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An opto-electronic device, comprising:
   at least one blue-violet III-nitride semipolar laser diode that comprises an AlGaN-cladding-free (ACF) laser diode, wherein the blue-violet III-nitride semipolar laser diode is comprised of one or more III-nitride layers epitaxially grown on or above a substrate in a semipolar (20-2-1) orientation, the III-nitride layers including a multiple quantum well (MQW) active region positioned between an n-type separate confinement heterostructure (SCH) and a p-type separate confinement heterostructure (SCH), the active region, the n-type separate confinement heterostructure and the p-type separate confinement heterostructure being positioned between one or more n-type III-nitride layers and one or more p-type III-nitride layers, the p-type III-nitride layers comprising Mg-doped p-type III-nitride layers, and the blue-violet III-nitride semipolar laser diode having an output power in excess of about 1 W, a slope efficiency of more than about 1 W/A, and an external quantum efficiency (EQE) in excess of about 35%.

2. The device of claim 1, wherein an emission wavelength of the blue-violet III-nitride semipolar laser diode is between about 380 nm and 480 nm.

3. The device of claim 1, wherein the blue-violet III-nitride semipolar laser diode excites one or more phosphors to produce white light.

4. The device of claim 1, further comprising an array of the blue-violet III-nitride semipolar laser diodes.

5. The device of claim 1, wherein the blue-violet III-nitride semipolar laser diode is comprised of one or more III-nitride layers grown on or above a free-standing III-nitride substrate.

6. The device of claim 5, wherein the free-standing III-nitride substrate is a thick semipolar III-nitride layer removed from a foreign substrate.

7. The device of claim 5, wherein the free-standing III-nitride substrate is a semipolar III-nitride wafer sawn from a bulk III-nitride ingot or boule.

8. The device of claim 1, wherein the blue-violet III-nitride semipolar laser diode is comprised of one or more III-nitride layers grown on or above a III-nitride template on a foreign substrate.

9. The device of claim 8, wherein the III-nitride template is an epitaxial lateral overgrowth (ELO) on or above the foreign substrate.

10. The device of claim 8, wherein the III-nitride template contains a nucleation or buffer layer.

11. The device of claim 1, wherein an electron blocking layer (EBL) is positioned between the active region and the p-type separate confinement hetero structure.

12. The device of claim 1, wherein the mg-doped p-type III-nitride layers comprise a relatively low Mg-doped p-type GaN cladding layer, a relatively high Mg-doped p-GaN cladding layer and a relatively highly Mg-doped p++-GaN contact layer.

13. A method for fabricating an opto-electronic device, comprising:
    epitaxially growing at least one blue-violet III-nitride semipolar laser diode that comprises an AlGaN-cladding-free (ACF) laser diode, wherein the blue-violet III-nitride semipolar laser diode is comprised of one or more III-nitride layers epitaxially grown on or above a substrate in a semipolar (20-2-1) orientation, the III-nitride layers including a multiple quantum well (MQW) active region positioned between an n-type separate confinement heterostructure (SCH) and a p-type separate confinement heterostructure (SCH), the n-type separate confinement heterostructure and the p-type separate confinement heterostructure being positioned between one or more n-type III-nitride layers and one or more p-type III-nitride layers, the p-type III-nitride layers comprising Mg-doped p-type III-nitride layers, and the blue-violet III-nitride semipolar laser diode having an output power in excess of about 1 W, a slope efficiency of more than about 1 W/A, and an external quantum efficiency (EQE) in excess of about 35%.

14. The method of claim 13, wherein an emission wavelength of the blue-violet III-nitride semipolar laser diode is between about 380 nm and 480 nm.

15. The method of claim 13, wherein the blue-violet III-nitride semipolar laser diode excites one or more phosphors to produce white light.

16. The method of claim 13, further comprising fabricating an array of the blue-violet III-nitride semipolar laser diodes.

17. The method of claim 13, wherein the blue-violet III-nitride semipolar laser diode is comprised of one or more III-nitride layers grown on or above a free-standing III-nitride substrate.

18. The method of claim 17, wherein the free-standing III-nitride substrate is a thick semipolar III-nitride layer removed from a foreign substrate.

19. The method of claim 17, wherein the free-standing III-nitride substrate is a semipolar III-nitride wafer sawn from a bulk III-nitride ingot or boule.

20. The method of claim 17, wherein the blue-violet III-nitride semipolar laser diode is comprised of one or more III-nitride layers grown on or above a III-nitride template on a foreign substrate.

21. The method of claim 20, wherein the III-nitride template is an epitaxial lateral overgrowth (ELO) on or above the foreign substrate.

22. The method of claim 20, wherein the III-nitride template contains a nucleation or buffer layer.

23. The method of claim 13, wherein an electron blocking layer (EBL) is positioned between the active region and the p-type separate confinement hetero structure.

24. The method of claim 13, wherein the Mg-doped p-type III-nitride layers comprise a relatively low Mg-doped p-type GaN cladding layer, a relatively high Mg-doped p-GaN cladding layer and a relatively highly Mg-doped p++-GaN contact layer.

* * * * *